(12) United States Patent
Jung et al.

(10) Patent No.: US 10,177,327 B2
(45) Date of Patent: Jan. 8, 2019

(54) METHOD OF MANUFACTURING AN ORGANIC LIGHT EMITTING DISPLAY DEVICE INCLUDING A FLEXIBLE SUBSTRATE AND A BENDING AREA

(71) Applicant: LG Display Co., Ltd., Seoul (KR)

(72) Inventors: Ilchan Jung, Wonju-si (KR); Jiyeon Kang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 57 days.

(21) Appl. No.: 15/691,060

(22) Filed: Aug. 30, 2017

(65) Prior Publication Data

US 2018/0076400 A1 Mar. 15, 2018

(30) Foreign Application Priority Data

Sep. 13, 2016 (KR) .................. 10-2016-0118224

(51) Int. Cl.
| | | |
|---|---|---|
| *H01L 51/00* | (2006.01) | |
| *B32B 7/12* | (2006.01) | |
| *B32B 17/06* | (2006.01) | |
| *H01L 27/32* | (2006.01) | |
| *H01L 51/52* | (2006.01) | |
| *H01L 51/56* | (2006.01) | |

(52) U.S. Cl.
CPC .......... *H01L 51/0097* (2013.01); *B32B 7/12* (2013.01); *B32B 17/064* (2013.01); *H01L 27/3244* (2013.01); *H01L 51/003* (2013.01); *H01L 51/5281* (2013.01); *H01L 51/56* (2013.01); *B32B 2457/206* (2013.01); *H01L 2227/326* (2013.01); *H01L 2251/5338* (2013.01); *H01L 2251/566* (2013.01)

(58) Field of Classification Search
CPC .............. H01L 27/3244; H01L 51/003; H01L 51/0097; H01L 2227/326; H01L 2251/5338

See application file for complete search history.

(56) References Cited

U.S. PATENT DOCUMENTS

2018/0026088 A1* 1/2018 Oh .................. H01L 22/32
361/749

* cited by examiner

*Primary Examiner* — Hoai V Pham
(74) *Attorney, Agent, or Firm* — Seed IP Law Group LLP

(57) ABSTRACT

Provided are an organic light emitting display device and a method of manufacturing the organic light emitting display device. The method of manufacturing an organic light emitting display device includes forming a sacrificial layer on a lower mother substrate in which a plurality of cells is defined, forming a flexible substrate on the sacrificial layer, forming a display unit including a circuit unit and an organic light emitting diode in each of the plurality of cells on the flexible substrate, removing the lower mother substrate, bonding a supporting film to the flexible substrate, irradiating a portion of the supporting film corresponding to a boundary of a bending area of the flexible substrate, removing a portion of the supporting film corresponding to the bending area of the flexible substrate, performing a process for enhancing adhesion of the supporting film remaining after removing a portion of the supporting film, irradiating a boundary between a non-display area extended from the bending area and a pad area extended from the non-display area, and separating the plurality of cells into cell units by irradiating boundaries of the plurality of cells.

15 Claims, 18 Drawing Sheets

METHOD OF MANUFACTURING AN ORGANIC LIGHT EMITTING DISPLAY DEVICE INCLUDING A FLEXIBLE SUBSTRATE AND A BENDING AREA

CROSS-REFERENCE TO RELATED APPLICATIONS

This application claims the priority of Korean Patent Application No. 10-2016-0118224 filed on Sep. 13, 2016, in the Korean Intellectual Property Office, the disclosure of which is incorporated herein by reference.

BACKGROUND

Technical Field

The present disclosure relates to an organic light emitting display device and a method of manufacturing the organic light emitting display device and more particularly, to an organic light emitting display device including a flexible substrate and a bending area for reducing a bezel area and a method of manufacturing the organic light emitting display device using a mother substrate.

Description of the Related Art

Recently, as the world reached a full-scale information age, the field of display for visually displaying electrical information signals has grown rapidly. In response thereto, various flat display devices with excellent performance in terms of thinning, weight lightening, and low power consumption have been developed and have rapidly replaced cathode ray tube (CRT) displays that have been used in the art.

Specific examples of the flat display devices include a liquid crystal display (LCD) device, an organic light emitting display (OLED) device, an electrophoretic display (EPD) device, a plasma display panel (PDP) device, and an electro-wetting display (EWD) device, and the like. Particularly, the OLED device, which is a next-generation display device with self-emitting characteristics, has excellent characteristics in terms of viewing angle, contrast, response speed, power consumption, etc., as compared with the LCD device.

In recent years, flexible display devices manufactured by forming a display unit and a line on a flexible substrate formed of a flexible material such as plastic have received attention as next-generation display devices. The flexible display devices have been widely used in the field of applications spanning from monitors of computers and televisions (TVs) to personal portable equipment. Further, a research on application of the flexible display devices to OLED devices is being conducted.

For manufacturing an OLED device, there is a method of manufacturing a cell unit OLED device by separately manufacturing each OLED device. Also, there is a method of manufacturing a mother substrate unit OLED device by simultaneously manufacturing a plurality of OLED devices using a mother substrate and then separating the plurality of OLED devices. In the method of manufacturing a cell unit OLED device from among the above-described two methods of manufacturing an OLED device, only one OLED device can be manufactured in a single process. Thus, the method of manufacturing a cell unit OLED device has disadvantages in terms of processing time and cost as compared with the method of manufacturing a mother substrate unit OLED device.

Meanwhile, modules such as a flexible printed circuit board (FPCB), a chip on film (COF), etc. are disposed on one side of a flexible OLED device. To prevent the FPCB or the COF components from being within view of a user, the FPCB or the COF is hidden by a back surface of the flexible substrate by bending one side of the flexible substrate containing the FPCB or the COF.

BRIEF SUMMARY

The inventors of the present disclosure have researched the method of manufacturing a mother substrate unit OLED device from among the above-described two methods of manufacturing an OLED device. Particularly, the inventors of the present disclosure have researched a method of manufacturing an OLED device using a flexible substrate. However, the inventors of the present disclosure recognized that various defects may occur during a process of bonding a mother substrate unit back plate to a back surface of a flexible substrate in order to support the flexible substrate and removing a back plate corresponding to a bending area.

Accordingly, the present disclosure is directed to an organic light emitting display device including a flexible substrate and a method of manufacturing the organic light emitting display device. The organic light emitting display device is manufactured on a mother substrate unit in an intermediate step to improve productivity.

The present disclosure is also directed to an organic light emitting display device including a back plate formed of a new material into a new structure and a method of manufacturing the organic light emitting display device. The organic light emitting display device can prevent defects which may occur during a process of manufacturing a mother substrate unit organic light emitting display device including a flexible substrate.

In some embodiments, the device includes a back plate, the back plate on a second protective film, an adhesive layer on the back plate, and a first protective film on the adhesive layer. The adhesive strength of a material of the adhesive layer may be changeable. Specifically, the adhesive strength of the material of the adhesive layer may be changed by UV curing, thermal curing, or chemical reaction. The adhesive layer has a thickness of 25 μm or less, and the adhesive layer includes a dispersion inhibitor and an adhesion enhancer.

In some embodiments, the device includes an organic light emitting display device. The organic light emitting display device includes a flexible substrate including a display area, a bending area extended from the display area, and a pad area extended from the bending area, a circuit unit positioned on a first surface of the flexible substrate, a display unit including an organic light emitting diode disposed on the circuit unit and electrically connected to the circuit unit, a polarizing plate on the display unit, an adhesive layer bonded to a second surface of the flexible substrate being an opposite surface of the first surface in an area except the bending area, and a supporting layer which is bonded to the adhesive layer and of which one side is disposed to correspond to one side of the flexible substrate. The adhesive strength of a material of the adhesive layer is changeable, and the supporting layer includes a first portion corresponding to the display area and a second portion corresponding to the pad area.

In some embodiments, a method of manufacturing an organic light emitting display device includes forming a sacrificial layer on a lower mother substrate in which a plurality of cells is defined, and forming a flexible substrate on the sacrificial layer, forming a display unit including a circuit unit and an organic light emitting diode in each of the plurality of cells on the flexible substrate. The method also includes removing the lower mother substrate, and bonding a supporting film to the flexible substrate. The method also includes irradiating a portion of the supporting film with a laser corresponding to a boundary of a bending area of the flexible substrate, and removing a portion of the supporting film corresponding to the bending area of the flexible substrate. The method also includes performing a process for enhancing adhesion of the supporting film remaining after removing a portion of the supporting film, and irradiating, with a laser, a boundary between a non-display area extended from the bending area and a pad area extended from the non-display area. The method also includes separating the plurality of cells into cell units by irradiating, with a laser, boundaries of the plurality of cells.

Details of other exemplary embodiments will be included in the detailed description of the disclosure and the accompanying drawings.

According to the present disclosure, an organic light emitting display device including a flexible substrate can be manufactured into a mother substrate unit, thereby reducing manufacturing costs and improving productivity.

Further, according to the present disclosure, during a process of manufacturing an organic light emitting display device including a flexible substrate into a mother substrate unit, it is possible to provide a back plate formed of a new material into a new structure so as not to place the back plate in a bending area.

Furthermore, according to the present disclosure, during a process of removing the back plate placed in the bending area, it is possible to suppress damage to the flexible substrate or an organic light emitting diode using the back plate formed of a new material into a new structure.

BRIEF DESCRIPTION OF THE DRAWINGS

The above and other aspects, features, or advantages of the present disclosure will be more clearly understood from the following detailed description taken in conjunction with the accompanying drawings, in which.

DETAILED DESCRIPTION

Figure 1:
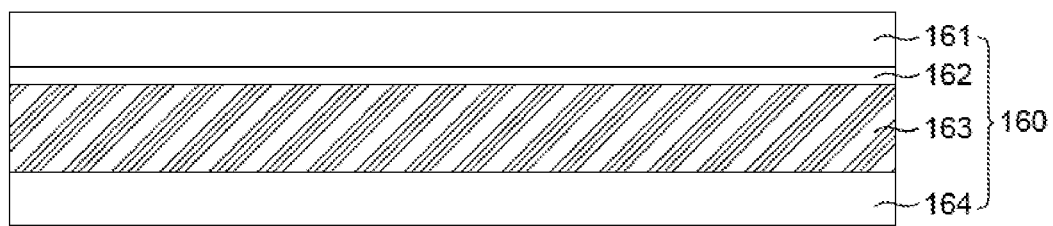
FIG. 1 is a cross-sectional view of a supporting film of an organic light emitting display device according to an exemplary embodiment of the present disclosure.

Advantages and features of the present disclosure, and methods for accomplishing the same, will be more clearly understood from exemplary embodiments described below with reference to the accompanying drawings. However, the present disclosure is not limited to the following exemplary embodiments but may be implemented in various different forms. The exemplary embodiments are provided to allow a person having ordinary skill in the art to fully understand all the various aspects of the present disclosure. The claims are not to be limited by the descriptions of the various embodiments, however.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Since the size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

Figure 3A:
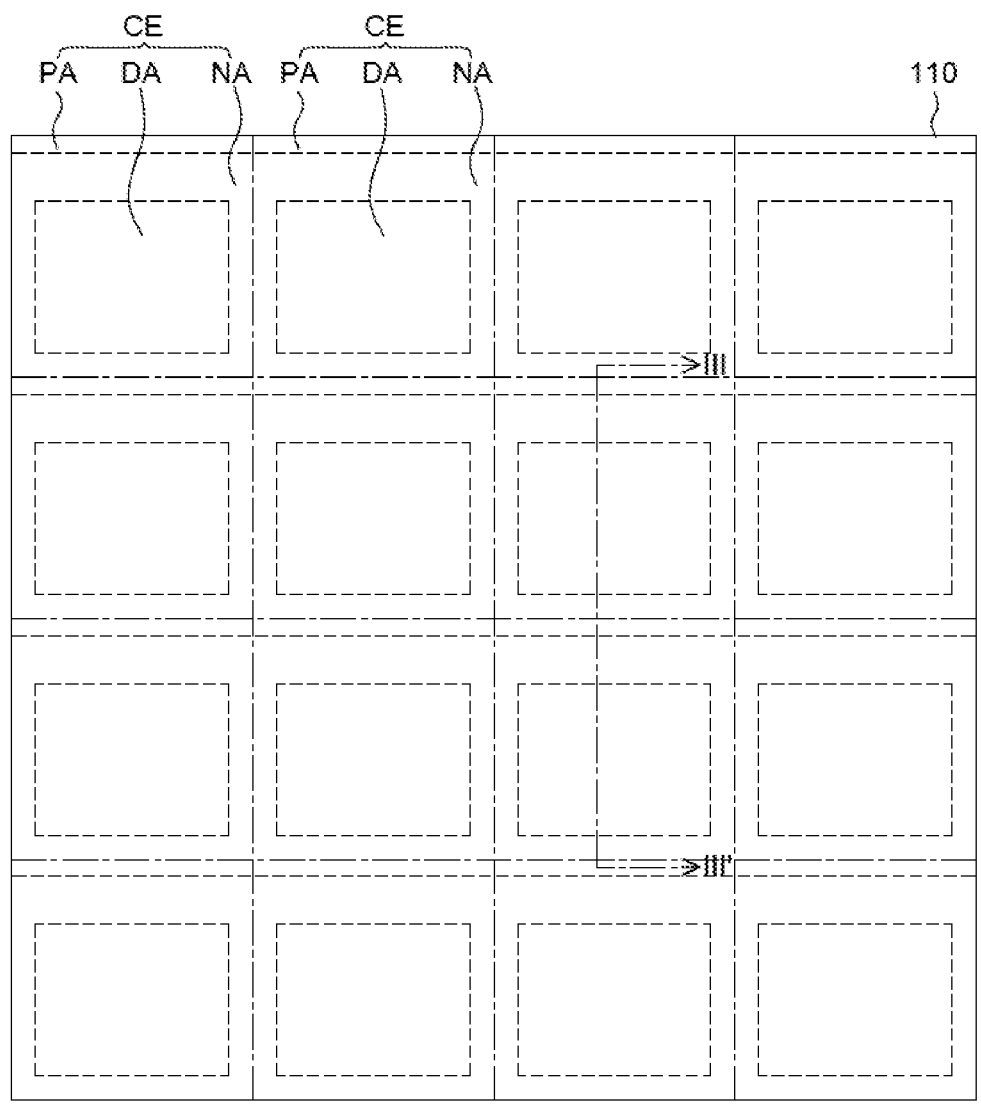
FIG. 3A through FIG. 3Q are plan and cross-sectional views provided to illustrate a method of manufacturing an organic light emitting display device according to an exemplary embodiment of the present disclosure.

FIG. 1 is a cross-sectional view of a supporting film of an organic light emitting display device according to an exemplary embodiment of the present disclosure. A supporting film (supporting layer) 160 illustrated in FIG. 1 is bonded to a back surface of a flexible substrate 120 after a mother substrate is removed during a process of manufacturing an organic light emitting display device into a mother substrate unit (as shown in FIGS. 3E and 3F). Referring to FIG. 1, the supporting film 160 includes a first protective film 161, a back plate 163, an adhesive layer 162, and a second protective film 164.

The first protective film 161 and the second protective film 164 are insulation films for protecting the back plate 163 and the adhesive layer 162. Specifically, the first protective film 161 is configured to protect the back plate 163 and the adhesive layer 162 until the back plate 163 and the adhesive layer 162 are bonded to the flexible substrate during the process of manufacturing an organic light emitting display device. Thus, the first protective film 161 may also be referred to as a release film. Also, the second protective film 164 is configured to protect the back plate 163 and the adhesive layer 162 before and after the adhesive layer 162 and the back plate 163 are bonded to the flexible substrate during the process of manufacturing an organic light emitting display device. The first protective film 161 and the second protective film 164 may be formed of a general polymer material, and may be, for example, polyethylene terephthalate (PET) films, polytetrafluoroethylene (PTFE) films, polyethylene (PE) films, polypropylene (PP) films, polybutene (PB) films, polybutadiene (PBD) films, vinyl chloride copolymer films, polyurethane (PU) films, ethylene vinyl acetate (EVA) films, ethylene-propylene copolymer films, ethylene-acrylate ethyl copolymer films, ethylene-acrylate methyl copolymer films, polyimide (PI) films, or the like.

The back plate 163 is configured to protect and support the flexible substrate of the organic light emitting display device. The back plate 163 may be formed of a plastic material, e.g., polyethylene terephthalate (PET). The function and arrangement of the back plate 163 will be described in detail below with reference to FIG. 2 through FIG. 4B.

The adhesive layer 162 provides adhesive strength for bonding the back plate 163 to the flexible substrate of the organic light emitting display device. In the adhesive layer 162, an initial adhesive strength in an initial state may be different from a final adhesive strength in a state after a predetermined process is performed. For example, the adhesive layer 162 may have a higher final adhesive strength in a state after a predetermined process is performed to the adhesive layer 162 than an initial adhesive strength in an initial state. The adhesive layer 162 may be formed of any adhesive material, including those having different adhesive strength between in an initial state and in a final state. The adhesive layer 162 may be formed of, e.g., an acryl-based material or silicon-based material, but is not limited thereto. A conventional adhesive layer has been used as an adhesive by adding a polymer to an acryl-based monomer. However, the adhesive layer 162 of the supporting film 160 in the organic light emitting display device according to an exemplary embodiment of the present disclosure can be used as a variable adhesive by adding a dispersion inhibitor and an adhesion enhancer to an acryl-based material or silicon-based material. Furthermore, the adhesive layer 162 may have a thickness of 25 μm or less.

The adhesive layer 162 may be a UV-curable adhesive layer. That is, the adhesive strength of a material of the adhesive layer 162 may be increased when a UV irradiation process is performed in an initial state. Initially, the adhesive layer 162 may have a low initial adhesive strength in a semi-curing state. Then, if the adhesive layer 162 is irradiated by a UV ray at a location where the supporting film 160 is bonded to the flexible substrate, the adhesive strength of the adhesive layer 162 is increased to be in a full-curing state. A final adhesive strength of the adhesive layer 162 in the full-curing state may be higher than the initial power of the adhesive layer 162 in the semi-curing state.

In some exemplary embodiments, the adhesive layer 162 may be a thermally curable adhesive layer. That is, the adhesive strength of a material of the adhesive layer 162 may be increased when a thermal curing process is performed in an initial state. Initially, the adhesive layer 162 may have an initial adhesive strength in a semi-curing state. Then, if heat is applied in a state where the supporting film 160 is bonded to the flexible substrate, the adhesive strength of the adhesive layer 162 is increased to be in a full-curing state. A final adhesive strength of the adhesive layer 162 may be higher than the initial power. In some embodiments, the thermal curing process may be performed for 5 minutes to 10 minutes at a temperature of 60° C. to 70° C. And in some embodiments, the thermal curing process may be performed several times.

In some exemplary embodiments, the adhesive layer 162 may be a chemically reactive adhesive layer. That is, the adhesive strength of a material of the adhesive layer 162 may be increased when a chemical reaction is performed on the adhesive layer 162 in an initial state. Initially, the adhesive layer 162 may have an initial adhesive strength in a semi-curing state. Then, a primer process may be performed to an adhesion target surface, i.e., one surface of the flexible substrate, to which the adhesive layer 162 is bonded, and then the adhesive layer 162 may be left at room temperature as being bonded to the adhesion target surface. In this case, the adhesive strength of the adhesive layer 162 is gradually increased in. Therefore, a final adhesive strength may be higher than the initial strength.

The adhesive layer 162 may have an initial adhesive strength which is higher than adhesive strength for the adhesive layer 162 to be bonded to the flexible substrate, but enough to be easily separated. That is, during a process of bonding the supporting film 160 to the flexible substrate, if an initial adhesive strength of the adhesive layer 162 is too low, the adhesive layer 162 may not be bonded to the flexible substrate. Therefore, the adhesive layer 162 may have an initial adhesive strength of 3 gf/inch or more. Further, during a process of removing a portion of the supporting film 160 corresponding to a bending area, if an initial adhesive strength of the supporting film 160 is too high, the supporting film 160 may not be separated at all or may be separated with damage to a surface of the flexible substrate or the organic light emitting diode. Therefore, the adhesive layer 162 may have an initial adhesive strength of 100 gf/inch or less.

Further, the adhesive layer 162 may have a final adhesive strength which is enough for the supporting film 160 to be stably bonded to the flexible substrate during the process of manufacturing an organic light emitting display device and in a final product state. That is, after the portion of the supporting film 160 corresponding to the bending area is removed, the supporting film 160 needs to be bonded to the flexible substrate without peeling-off. Therefore, the adhesive layer 162 may have a final adhesive strength of 300 gf/inch or more.

The organic light emitting display device using the supporting film 160 and the adhesive strength of the adhesive layer 162 and the method of manufacturing the organic light emitting display device will be described in more detail with reference to FIG. 2 through FIG. 3Q.

Figure 2:
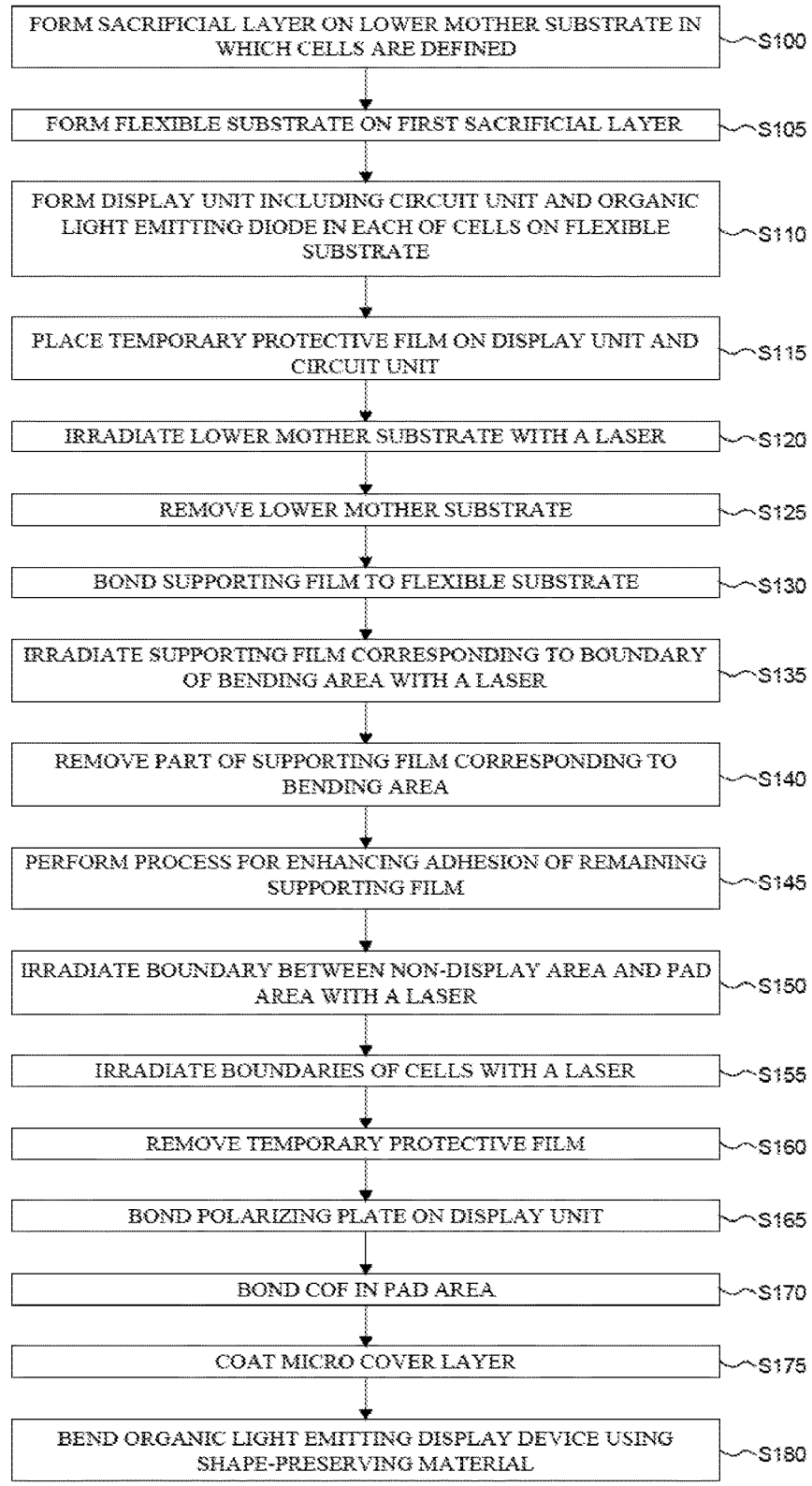
FIG. 2 is a flowchart of a method of manufacturing an organic light emitting display device according to an exemplary embodiment of the present disclosure.

FIG. 2 is a flowchart of a method of manufacturing an organic light emitting display device according to an exemplary embodiment of the present disclosure. FIG. 3A through FIG. 3Q are plan and cross-sectional views provided to illustrate a method of manufacturing an organic light emitting display device according to an exemplary embodiment of the present disclosure.

Firstly, a sacrificial layer 111 is formed on a lower mother substrate 110 in which a plurality of cells CE is defined (S100).

The lower mother substrate 110 is configured to support a flexible substrate 120 and components disposed on the flexible substrate 120 during a process of manufacturing an organic light emitting display device. The lower mother substrate 110 may be formed of a rigid material, e.g., glass, but is not limited thereto.

Referring to FIG. 3A, the lower mother substrate 110 is used to manufacture a plurality of organic light emitting display devices at the same time. In the lower mother substrate 110, the plurality of cells CE is defined. Each one of the plurality of cells CE defined in the lower mother substrate 110 corresponds to one organic light emitting display device. FIG. 3A illustrates that sixteen (16) cells CE are defined in the lower mother substrate 110 for convenience in explanation, but the present disclosure is not limited thereto.

Each of the plurality of cells CE includes a display area DA, a non-display area NA, and a pad area PA. The display area DA is an area where an organic light emitting diode is disposed to display an image, and is located in a central portion within the cell CE. A circuit unit 130 including components, such as a driving thin film transistor, a switching thin film transistor, a storage capacitor, or a line may be disposed in the display area DA. The non-display area NA is an area where an image is not displayed, and surrounds the display area DA. The circuit unit 130 may also be disposed in the non-display area NA. The pad area PA is an area where modules disposed in the organic light emitting display device, such as a flexible printed circuit board, a chip on film (COF), etc., are disposed. A pad electrode electrically connected to the modules is disposed in the pad area PA. The pad area PA is extended from one side of the non-display area NA. FIG. 3A illustrates that the pad area PA is separate from the non-display area NA. However, the pad area PA may be defined as being included in the non-display area NA and located on one side of the non-display area NA. FIG. 3A illustrates that boundaries of the plurality of cells CE are indicated by a dashed dotted line and boundaries of the display areas DA, the non-display areas NA, and the pad areas PA within the plurality of cells CE are indicated by a dotted line.

Figure 3B:
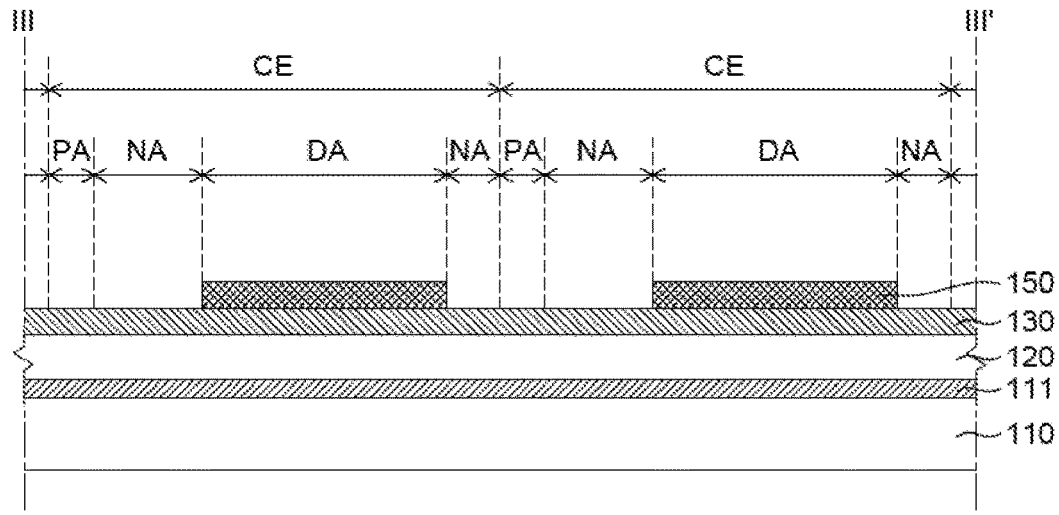

Referring to FIG. 3B, the sacrificial layer 111 is formed on the lower mother substrate 110. The adhesive strength of a material of sacrificial layer 111 may be set by irradiation of a laser so as to reduce adhesive strength with respect to the flexible substrate 120, as is described later. For example, the sacrificial layer 111 may have a structure in which a silicon nitride (SiNx) layer and a silicon oxide (SiOx) layer are laminated. The sacrificial layer 111 may be formed by depositing silicon nitride and silicon oxide on the entire surface of the lower mother substrate 110.

Then, the flexible substrate 120 is formed on the sacrificial layer 111 (S105).

The flexible substrate 120 illustrated in FIG. 3B supports various components of the organic light emitting display device. The flexible substrate 120 may be formed of a flexible plastic material, e.g., polyimide (PI) or photo acryl. If the flexible substrate 120 is formed of polyimide (PI), the flexible substrate 120 may be formed by a squeeze method.

Then, the circuit unit 130 and a display unit 150 including an organic light emitting diode are formed on the flexible substrate 120 in each of the plurality of cells CE (S110).

The circuit unit 130 is formed on the flexible substrate 120 in the display area DA or the non-display area NA of each cell CE. In one example, the circuit unit 130 for driving the organic light emitting diode may be formed in the display area DA. Further, the circuit unit 130 for driving the organic light emitting diode may also be formed in the non-display area NA of each cell CE. For example, a gate driver such as a GIP (Gate in Panel) may be formed in the non-display area NA. FIG. 3B illustrates the circuit unit 130 as a single layer for convenience in explanation.

The display unit 150 including the organic light emitting diode is formed on the flexible substrate 120 in the display area DA of each cell CE. The organic light emitting diode may be disposed on the circuit unit 130. The organic light emitting diode may include an anode electrically connected to the driving thin film transistor of the circuit unit 130, an organic layer on the anode, and a cathode on the organic layer. The organic layer may include, e.g., a hole transport layer, a hole injection layer, an organic light emitting layer, an electron injection layer, and an electron transport layer.

Although not illustrated in FIG. 3B, an encapsulation unit may be disposed on the display unit 150. The encapsulation unit is configured to cover the display unit 150 in order to protect the organic light emitting diode, which is vulnerable to moisture, so as not to be exposed to moisture. The encapsulation unit may have a structure in which an inorganic layer and an organic layer are alternately laminated. For example, the encapsulation unit may include a first inorganic layer formed of an inorganic material, an organic layer disposed on the first inorganic layer and formed of an organic material, and a second inorganic layer disposed on the organic layer to cover the organic layer and formed of an inorganic material, but is not limited thereto.

Then, a temporary protective film 140 is disposed on the display unit 150 and the circuit unit 130 (S115).

Figure 3C:
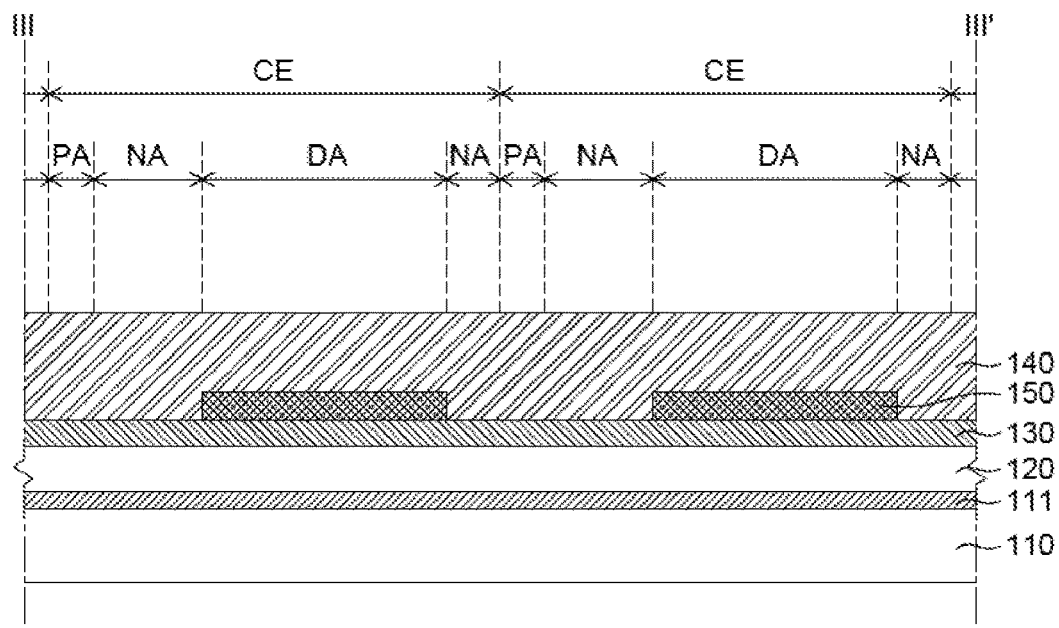

Referring to FIG. 3C, the temporary protective film 140 is disposed on the display unit 150 and the circuit unit 130. The temporary protective film 140 is configured to protect the display unit 150 and the circuit unit 130 during the process of manufacturing an organic light emitting display device. The temporary protective film 140 is removed after being temporarily used during the process of manufacturing an organic light emitting display device. The temporary protective film 140 is disposed corresponding to the entire surface of the lower mother substrate 110.

The temporary protective film 140 may include a base film and an adhesive layer disposed on one surface of the base film. The base film of the temporary protective film 140 is formed of a plastic material and configured to support the adhesive layer. The base film of the temporary protective film 140 may be formed of, e.g., polyethylene terephthalate (PET). The adhesive layer of the temporary protective film 140 may be formed of an adhesive material. Although will be described later, the temporary protective film 140 needs to be removed during the process of manufacturing an organic light emitting display device but should not be separated when being adsorbed by a bonding plate for fixing during the manufacturing process. Therefore, release power of the adhesive layer of the temporary protective film 140 is a primary factor for selecting a material of the adhesive layer. The temporary protective film 140 may have an adhesive strength of 10 gf/inch or less, preferably 5.3 gf/inch, in order to be easily removed during the process of manufacturing an organic light emitting display device and not to be separated when being adsorbed by the bonding plate.

Preferably, the adhesive layer may not be exposed to the outside until the temporary protective film 140 is used to manufacture an organic light emitting display device. Therefore, in order to protect the adhesive layer of the temporary protective film 140, the temporary protective film 140 may be transferred in a state where a release film is bonded to the adhesive layer. Then, the release film may be removed to expose the adhesive layer of the temporary protective film 140, so that the temporary protective film 140 may be used.

If the temporary protective film 140 is disposed in a partial area rather than in the entire surface of the lower mother substrate 110, there may be problem during a process of bonding the supporting film 160 to be described below. For example, each of a plurality of temporary protective films 140 may be disposed corresponding to each cell CE or each of the plurality of temporary protective films 140 of a stick type may be disposed corresponding to each row. In this case, there may be a space where the temporary protective film 140 is not disposed, so that a step structure may be formed. Therefore, during the process of bonding the supporting film 160, a pressure for bonding the supporting film 160 may not be uniformly applied due to the above-described step structure. Therefore, when the supporting film 160 is bonded, bubbles may be formed or faulty bonding/removal may occur. Accordingly, in the method of manufacturing an organic light emitting display device according to an exemplary embodiment of the present disclosure, the temporary protective film 140 is disposed corresponding to the entire surface of the lower mother substrate 110. Other measures may also be used to prevent formation of bubbles between temporary protective film 140 and the mother substrate. Thus, it is possible to solve the above-described problem which may occur when the supporting film 160 is bonded.

When the temporary protective film 140 is disposed, the temporary protective film 140 may be disposed such that the adhesive layer from among the base film and the adhesive layer of the temporary protective film 140 faces the display unit 150. Further, if the encapsulation unit is disposed on the display unit 150 as described above, the temporary protective film 140 may be disposed such that the adhesive layer of the temporary protective film 140 can be in contact with the encapsulation unit.

In some exemplary embodiments, a barrier film may be disposed between the display unit 150 and the circuit unit 130 and the temporary protective film 140. As described above, the organic light emitting diode can be vulnerable to moisture. Thus, the barrier film may be disposed to cover at least the display unit 150.

Then, a back surface of the lower mother substrate 110 as an opposite surface of a surface on which the sacrificial layer 111 is disposed may be cleaned. Specifically, the back surface of the lower mother substrate 110 may be cleaned using a brush. During the process of manufacturing an organic light emitting display device, staining foreign materials such as fingerprints, saliva, etc. may be disposed on the back surface of the lower mother substrate 110. Furthermore, floating foreign materials such as scraps of thread and others may be disposed on the back surface of the lower mother substrate 110. Thus, in the method of manufacturing an organic light emitting display device according to an exemplary embodiment of the present disclosure, the process of cleaning the back surface of the lower mother substrate 110 using a brush is employed. Thus, it is possible to remove staining foreign materials and floating foreign materials and also possible to suppress damage caused by scratches or the like.

Then, the lower mother substrate 110 is irradiated with a laser (S120).

Figure 3D:
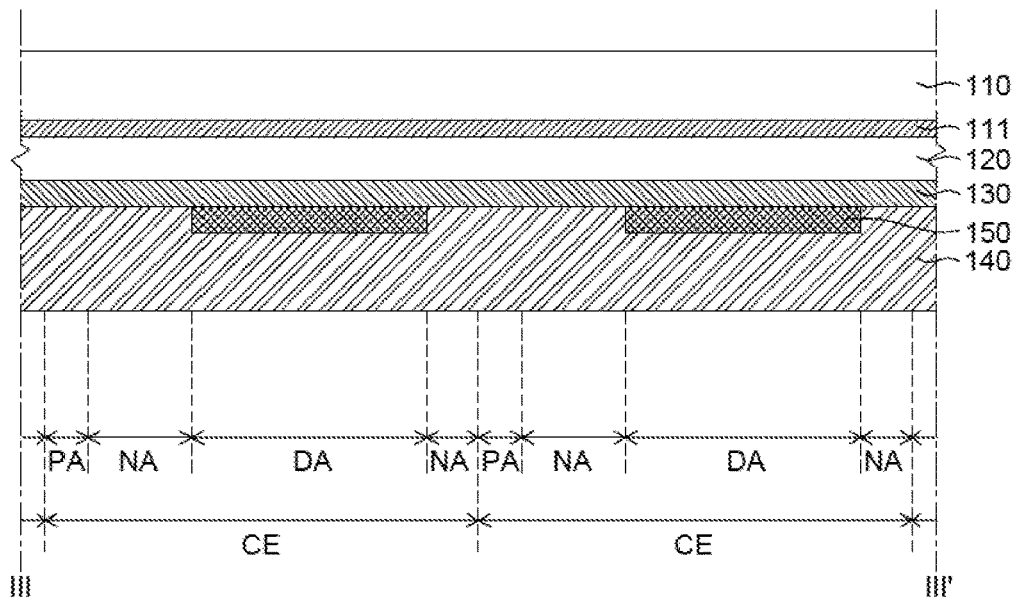
Figure 3E:
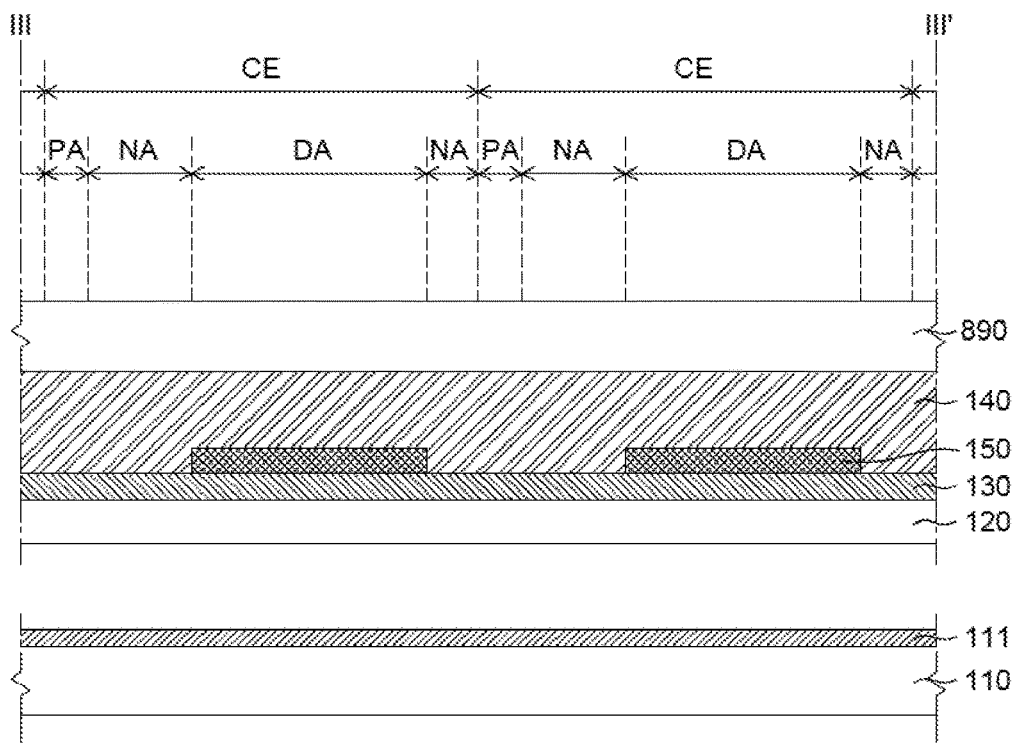
Figure 3F:
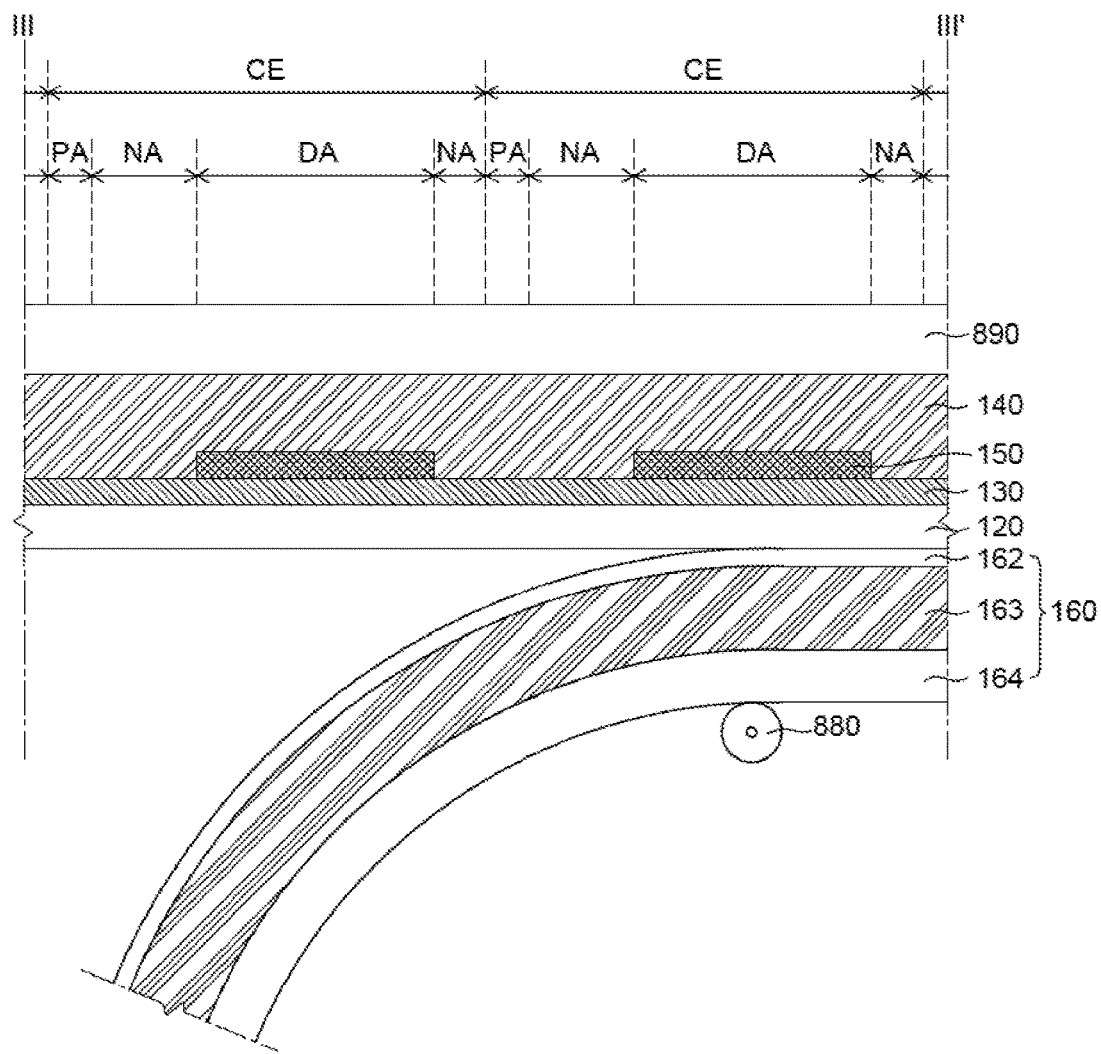

Referring to FIG. 3D, a laser is used to irradiate the back surface of the lower mother substrate 110, i.e., the opposite surface of the surface of the lower mother substrate 110 on which the sacrificial layer 111 is disposed. Specifically, in a state where the lower mother substrate 110, the sacrificial layer 111, the flexible substrate 120, the circuit unit 130, the display unit 150, and the temporary protective film 140 illustrated in FIG. 3C are upside down, a first laser source 810 is disposed to be spaced at a predetermined distance from the back surface of the lower mother substrate 110. The first laser source 810 may be a laser source configured to generate a UV laser. Then, when a laser is radiated from the first laser source 810, adhesive strength between the sacrificial layer 111 and the flexible substrate 120 may be decreased. Therefore, as described below, the lower mother substrate 110 and the flexible substrate 120 may be separated from each other.

Meanwhile, if the sacrificial layer 111 and/or the flexible substrate 120 are not normally formed during the process of manufacturing an organic light emitting display device, the lower mother substrate 110 and the flexible substrate 120 may not be separated from each other. Specifically, the sacrificial layer 111 and the flexible substrate 120 may not be formed in the entire surface of the lower mother substrate 110, but may be formed only in a partial area of the lower mother substrate 110. The sacrificial layer 111 is formed on the lower mother substrate 110 by a deposition process, and the flexible substrate 120 is formed on the lower mother substrate 110 by a squeeze process. The sacrificial layer 111 and the flexible substrate 120 may not be formed in an area adjacent to an edge of the lower mother substrate 110 due to a process error or the like. Further, only any one of the sacrificial layer 111 and the flexible substrate 120 may not be formed in the area adjacent to the edge of the lower mother substrate 110.

At least one of the sacrificial layer 111 and the flexible substrate 120 may not be formed in the area adjacent to the edge of the lower mother substrate 110 as described above. In this case, even if the lower mother substrate 110 is irradiated, the lower mother substrate 110 and the flexible substrate 120 may not be separated from each other. Thus, during a process of separating the lower mother substrate 110 and the flexible substrate 120 after the laser irradiation process, the lower mother substrate 110 may not be separated. Therefore, in manufacturing products, a defect rate may be increased and productivity decreased.

Accordingly, in the method of manufacturing an organic light emitting display device according to an exemplary embodiment of the present disclosure, the lower mother substrate 110 may be irradiated and then the temporary protective film 140 along the edge of the lower mother substrate 110 may be irradiated. That is, a laser may be radiated along a line inwardly spaced at a predetermined distance from an end of the lower mother substrate 110. Thus, the temporary protective film 140, the circuit unit 130, the flexible substrate 120, and the sacrificial layer 111 disposed on the edge of the lower mother substrate 110 may be etched.

Then, the lower mother substrate 110 is removed (S125).

Referring to FIG. 3E, the flexible substrate 120 and the lower mother substrate 110 are separated by removing the lower mother substrate 110. Specifically, the temporary protective film 140 may be fixed to a bonding stage 890 by bonding the bonding stage to the temporary protective film 140 and then, the bonding stage 890 is moved upwardly. Thus, the flexible substrate 120 and the lower mother substrate 110 may be separated. However, the present disclosure is not limited thereto. The flexible substrate 120 and the lower mother substrate 110 may be separated using another means instead of the bonding stage 890.

Meanwhile, a laser is radiated along the line inwardly spaced at the predetermined distance from the end of the lower mother substrate 110 as described above. Thus, the temporary protective film 140, the circuit unit 130, the flexible substrate 120, and the sacrificial layer 111 disposed on the edge of the lower mother substrate 110 may remain as being fixed to the lower mother substrate 110 during the process of separating the flexible substrate 120 and the lower mother substrate 110.

Then, the supporting film 160 is bonded to the flexible substrate 120 (S130).

Referring to FIG. 3F, the supporting film 160 is bonded to a back surface of the flexible substrate 120 in a state where the temporary protective film 140, the display unit 150, the circuit unit 130, and the flexible substrate 120 are bonded to the bonding stage 890. In this case, the first protective film 161 as a release film is removed from the supporting film 160 illustrated in FIG. 1. Thus, the supporting film 160 may be bonded using a roller 880 such that the adhesive layer 162 from among the adhesive layer 162, the back plate 163, and the second protective film 164 can be in contact with the back surface of the flexible substrate 120. FIG. 3F illustrates an exemplary embodiment in which the supporting film 160 is bonded using the roller 880 in a state where the back surface of the flexible substrate 120 faces downwardly, but the present disclosure is not limited thereto. In a state where the components illustrated in FIG. 3F are in an inverse state, i.e., the back surface of the flexible substrate 120 faces upwardly, the supporting film 160 may be bonded to the flexible substrate 120 using the roller 880.

Then, the supporting film 160 corresponding to a boundary of a bending area BA is irradiated with a laser (S135).

Figure 3G:
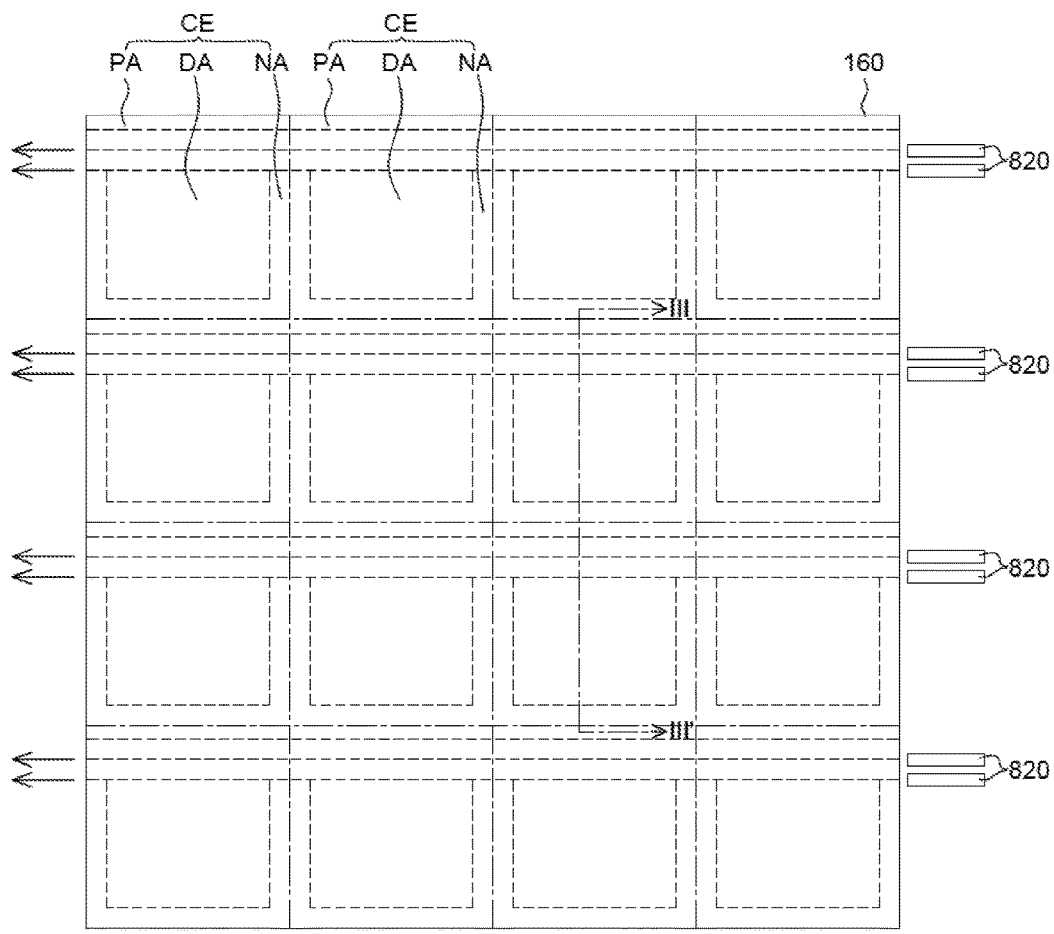
Figure 3H:
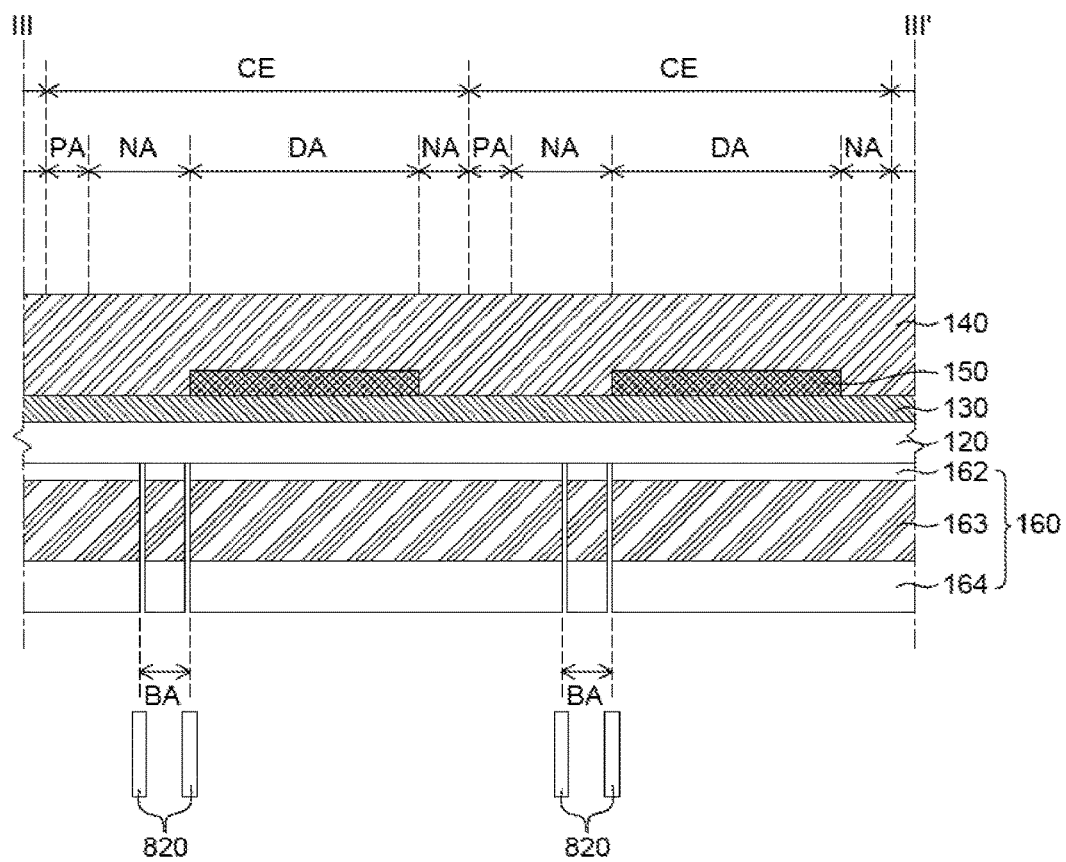

Referring to FIG. 3G and FIG. 3H, the supporting film 160 corresponding to the boundary of the bending area BA is irradiated using a second laser source 820. The bending area BA is a partial area of the non-display area NA of the organic light emitting display device. The bending area BA is bent in order for modules disposed on one side of the organic light emitting display device, such as a flexible printed circuit board, a chip on film (COF), etc., to be disposed on the back surface of the flexible substrate 120. The bending area BA is disposed between the display area DA and the pad area PA.

Referring to FIG. 3G and FIG. 3H, the second laser source 820 may radiate a laser while moving on the supporting film 160 along the boundary of the bending area BA. That is, as illustrated in FIG. 3G, the second laser source 820 may radiate a laser to the boundary of the bending area BA while moving from right to left of the supporting film 160 in a direction as indicated by arrows. However, the present disclosure is not limited thereto. The second laser source 820 may radiate a laser while moving in the opposite direction. Otherwise, the second laser source 820 may be fixed, whereas the temporary protective film 140, the display unit 150, the circuit unit 130, the flexible substrate 120, and the supporting film 160 may be moved. The second laser source 820 may be a laser source configured to radiate a $CO_2$ laser or a laser source configured to radiate a UV laser.

Since the boundary of the bending area BA is irradiated as described above, the supporting film 160 corresponding to the boundary of the bending area BA may be etched as illustrated in FIG. 3H. That is, only the supporting film 160 may be etched by adjusting the intensity and radiation time of a laser generated by the second laser source 820.

Then, a portion of the supporting film 160 corresponding to the bending area BA is removed (S140).

Figure 3I:
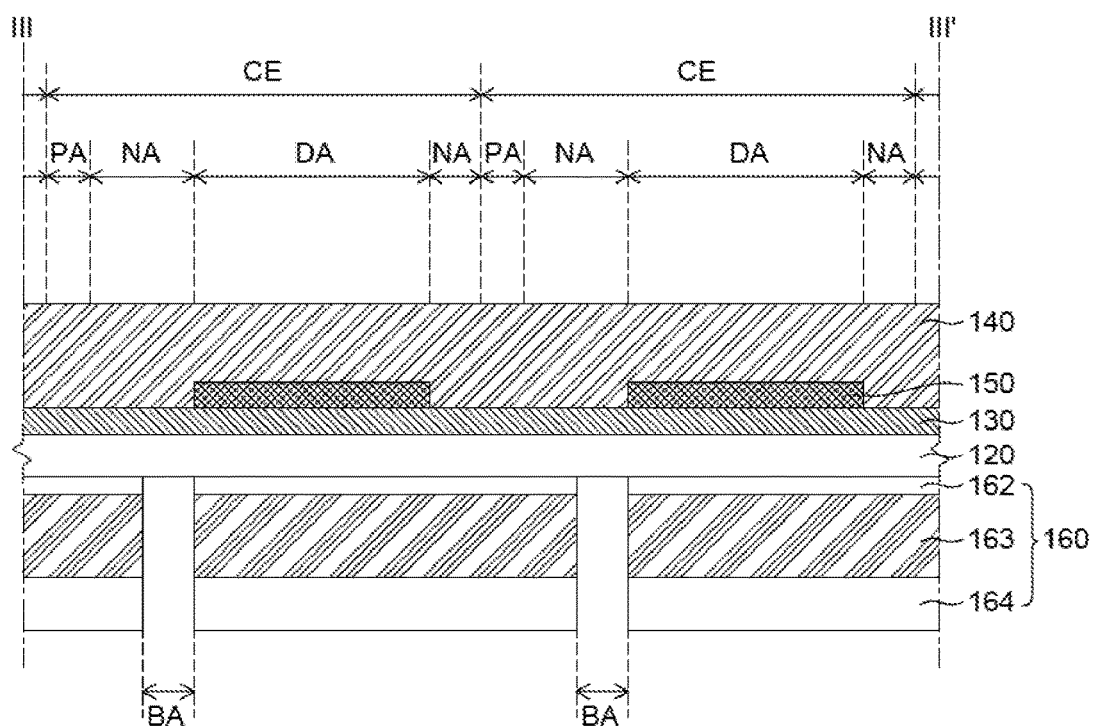

Referring to FIG. 3I, the portion of the supporting film 160 corresponding to the bending area BA is removed. As described above, the adhesive layer 162 of the supporting film 160 has an initial adhesive strength which is enough for the supporting film 160 to be easily removed from the flexible substrate 120. Therefore, it is easy to remove the supporting film 160 corresponding to the bending area BA. An adhesive tape may be used to remove the supporting film 160 disposed in the bending area BA, but the present disclosure is not limited thereto. Since the portion of the supporting film 160 corresponding to the bending area BA is removed, the flexible substrate 120 can be more easily bent.

Then, a process for enhancing adhesion of the remaining supporting film 160 is performed (S145).

As described above, in the adhesive layer 162 of the supporting film 160, an initial adhesive strength in an initial state may be different from a final adhesive strength in a state after a predetermined process is performed. The adhesive layer 162 may have a higher final adhesive strength in a state after a predetermined process is performed to the adhesive layer 162 than an initial adhesive strength in an initial state. In order to remove the portion of the supporting film 160 corresponding to the bending area BA as described above, the initial adhesive strength may be lower than the final adhesive strength. However, after the portion of the supporting film 160 corresponding to the bending area BA is removed, adhesion of the remaining supporting film 160 corresponding to the other area except the bending area BA needs to be enhanced. Then, during the process of manufacturing an organic light emitting display device and after completion of manufacturing an organic light emitting display device, it is possible to suppress separation of the supporting film 160 from the flexible substrate 120. Thus, in the method of manufacturing an organic light emitting display device according to an exemplary embodiment of the present disclosure, after the portion of the supporting film 160 corresponding to the bending area BA is removed, the process for enhancing adhesion of the remaining supporting film 160 is performed.

If the adhesive layer 162 is a UV-curable adhesive layer 162, a UV irradiation process may be performed to increase adhesive strength of the adhesive layer 162. When the UV irradiation process is performed to the adhesive layer 162, the adhesive strength of the adhesive layer 162 may be increased to be in a full-curing state. Thus, the supporting film 160 can be more strongly bonded to the flexible substrate 120, so that separation can be suppressed.

Further, if the adhesive layer 162 is a thermally curable adhesive layer 162, a thermal curing process such as a baking process may be performed to increase adhesive strength of the adhesive layer 162. For example, the thermal curing process may be performed for 5 minutes to 10 minutes at a temperature of 60° C. to 70° C. Otherwise, the thermal curing process may be performed several times. Since the thermal curing process is performed to the adhesive layer 162, the adhesive strength of the adhesive layer 162 is increased to be in a full-curing state. Thus, the supporting film 160 can be more strongly bonded to the flexible substrate 120, so that separation can be suppressed.

Furthermore, if the adhesive layer 162 is a chemically reactive adhesive layer 162, a primer process may be performed to an adhesion target surface, i.e., one surface of the flexible substrate 120, to which the adhesive layer 162 is bonded, and then the adhesive layer 162 may be left at room temperature as being bonded to the adhesion target surface. In this case, the adhesive strength of the adhesive layer 162 can be gradually increased. Thus, the supporting film 160 can be more strongly bonded to the flexible substrate 120, so that separation can be suppressed.

Then, a boundary between the non-display area NA and the pad area PA is irradiated with a laser (S150).

Figure 3J:
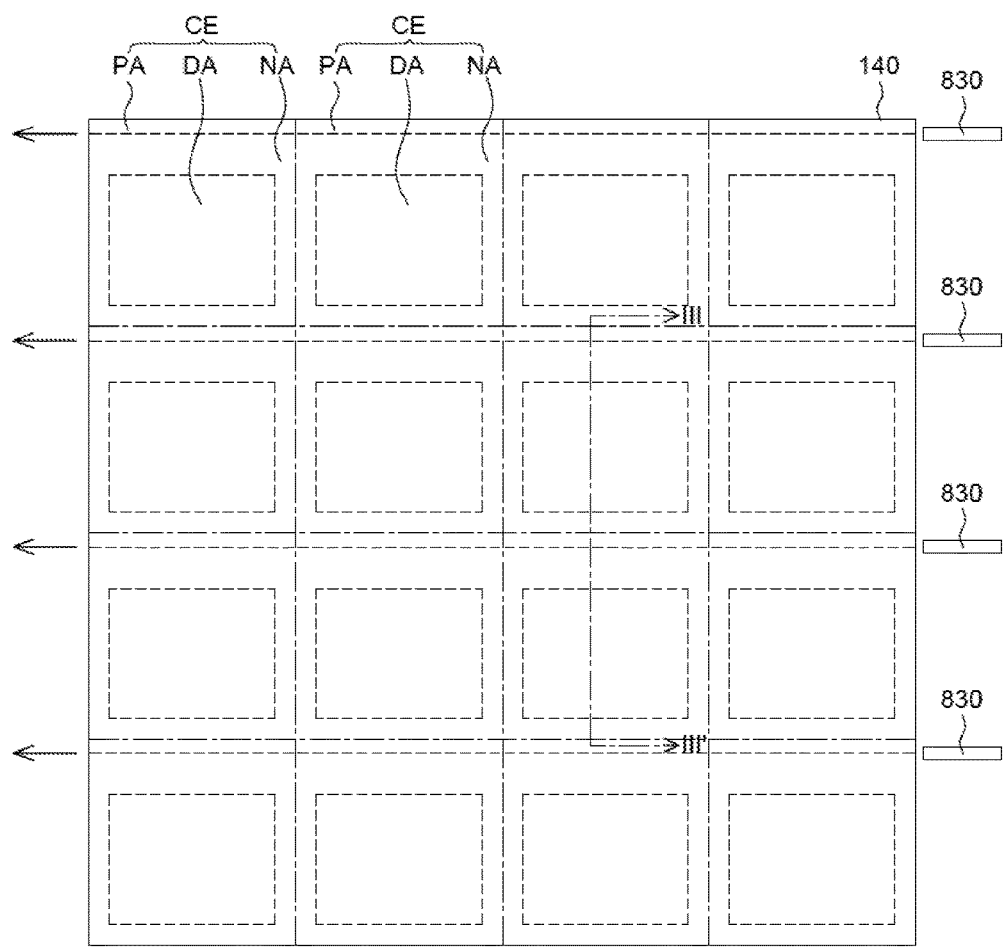
Figure 3K:
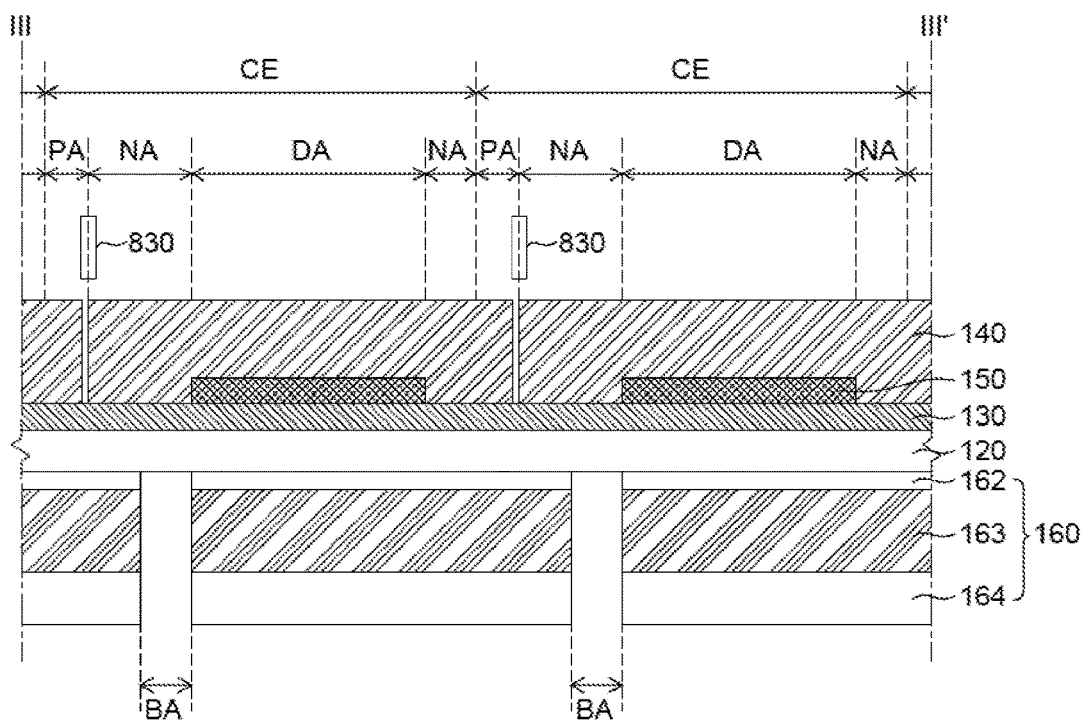

Referring to FIG. 3J and FIG. 3K, the boundary between the non-display area NA and the pad area PA is irradiated using a third laser source 830. The third laser source 830 may radiate a laser to the boundary between the non-display area NA and the pad area PA while moving on the temporary protective film 140 along the boundary between the non-display area NA and the pad area PA. That is, as illustrated in FIG. 3J, the third laser source 830 may radiate a laser to the boundary between the non-display area NA and the pad area PA while moving from right to left of the temporary protective film 140 in a direction as indicated by arrows. However, the present disclosure is not limited thereto. The third laser source 830 may radiate a laser while moving in the opposite direction. Otherwise, the third laser source 830 may be fixed, whereas the temporary protective film 140, the display unit 150, the circuit unit 130, the flexible substrate 120, and the supporting film 160 may be moved. The third laser source 830 may be a laser source configured to radiate a $CO_2$ laser or a laser source configured to radiate a UV laser.

Since the boundary between the non-display area NA and the pad area PA is irradiated as described above, the temporary protective film 140 corresponding to the boundary between the non-display area NA and the pad area PA may be etched as illustrated in FIG. 3K. That is, only the temporary protective film 140 may be etched by adjusting the intensity and radiation time of a laser generated by the third laser source 830.

Then, boundaries of the plurality of cells CE are irradiated with a laser (S155).

Figure 3L:
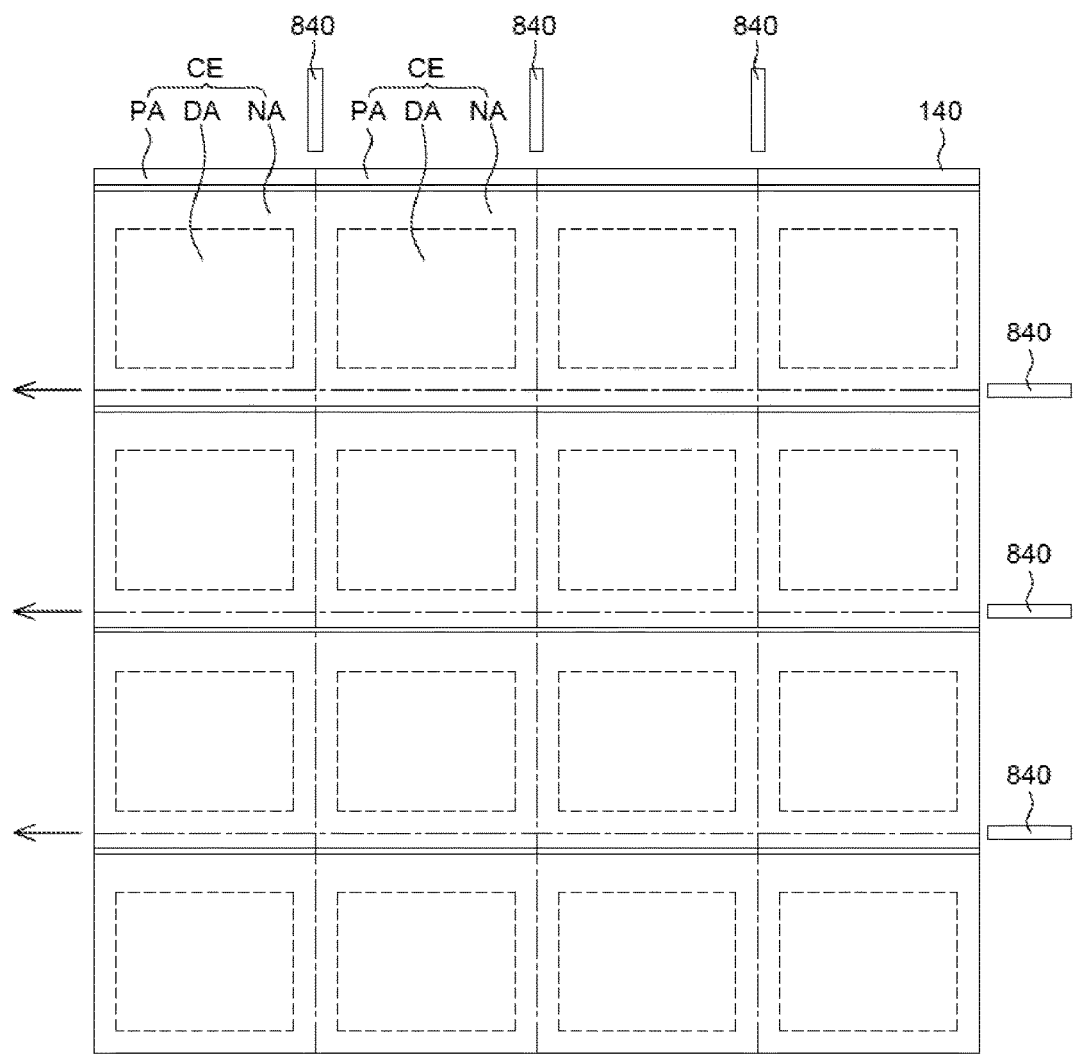
Figure 3M:
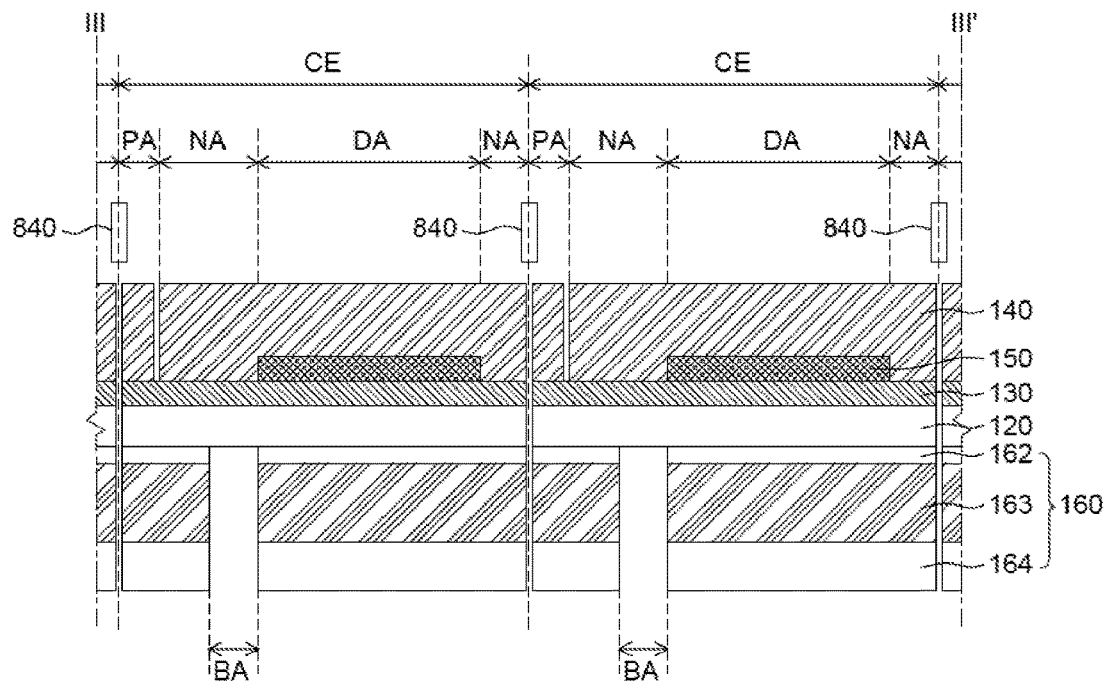

Referring to FIG. 3L and FIG. 3M, the boundaries of the plurality of cells CE are irradiated using a fourth laser source 840. The fourth laser source 840 may radiate a laser to the boundaries of the plurality of cells CE while moving on the temporary protective film 140 along the boundaries of the plurality of cells CE. That is, as illustrated in FIG. 3L, the fourth laser source 840 may radiate a laser to the boundaries of the plurality of cells CE while moving from above to below the temporary protective film 140 in a direction as indicated by arrows and may also radiate a laser to the boundaries of the plurality of cells CE while moving from right to left of the temporary protective film 140 in a direction as indicated by arrows. However, the present disclosure is not limited thereto. The fourth laser source 840 may radiate a laser while moving in the opposite direction. The fourth laser source 840 may be a laser source configured to radiate a UV laser or a laser source configured to radiate a $CO_2$ laser and a UV laser. In some exemplary embodiments, a plurality of laser sources may be used to radiate a laser to the boundaries of the plurality of cells CE. That is, a laser source configured to radiate a $CO_2$ laser and another laser source configured to radiate a UV laser may be used.

Since the boundaries of the plurality of cells CE are irradiated as described above, the temporary protective film 140, the display unit 150, the flexible substrate 120, and the supporting film 160 may be etched into a plurality of cell units as illustrated in FIG. 3M. Therefore, a plurality of organic light emitting display devices can be divided into cell unit organic light emitting display devices.

Then, the temporary protective film 140 is removed (S160).

Figure 3N:
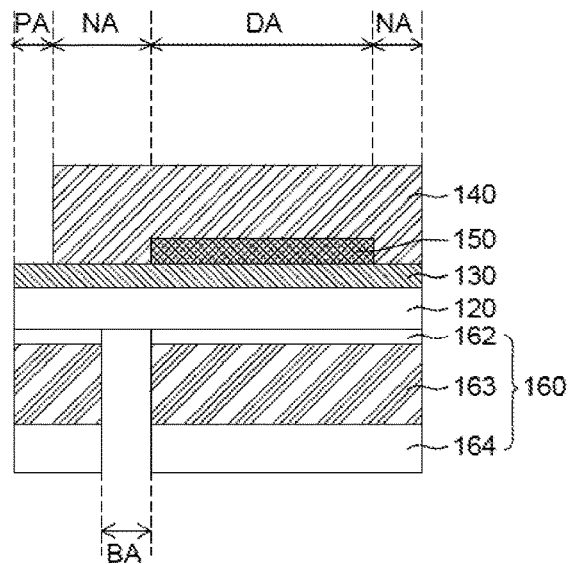

Referring to FIG. 3N, a portion of the temporary protective film 140 corresponding to the pad area PA is removed. FIG. 3N illustrates only an organic light emitting display device corresponding to a cell CE from among the plurality of cells CE. As described above, the release power of the adhesive layer of the temporary protective film 140 has a value enough for the adhesive layer to be easily removed from the display unit 150 or the encapsulation unit. Therefore, it is easy to remove the temporary protective film 140 disposed in the pad area PA. An adhesive tape may be used to remove the temporary protective film 140 disposed in the pad area PA, but the present disclosure is not limited thereto.

Then, a dry-cleaning process may be performed to the pad area PA. Specifically, the dry-cleaning process may be performed by injecting air with a dry cleaner, so that foreign materials disposed in the pad area PA can be easily removed. As described above, the organic light emitting diode of the display unit 150 is vulnerable to moisture. Thus, by performing the drying cleaning process, it is possible to minimize damage to the organic light emitting diode by moisture during a cleaning process.

Then, a lighting test may be performed through the pad electrode disposed in the pad area PA. That is, the lighting test may be performed to the pad electrode using a probe or the like. The pad electrode is disposed in the pad area PA from which the temporary protective film 140 is removed. If necessary, another test may be performed.

Figure 3O:
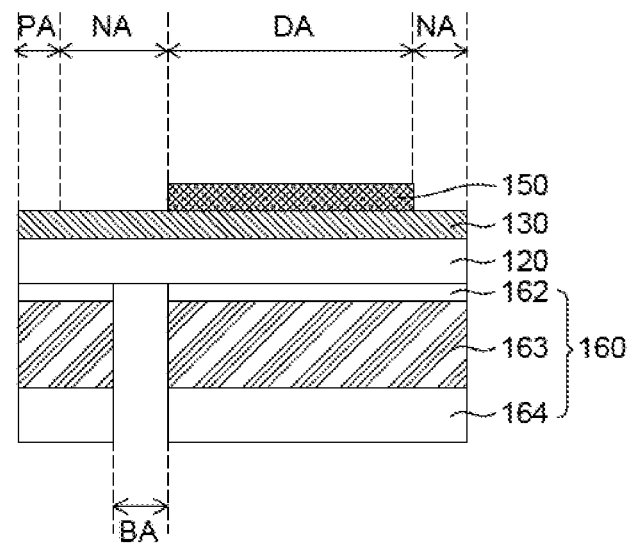

Then, referring to FIG. 3O, the temporary protective film 140 corresponding to the non-display area NA and the display area DA is removed. An adhesive tape may be used to remove the temporary protective film 140 corresponding to the non-display area NA and the display area DA, but the present disclosure is not limited thereto.

Then, a polarizing plate 170 is bonded on the display unit 150 (S165).

Figure 3P:
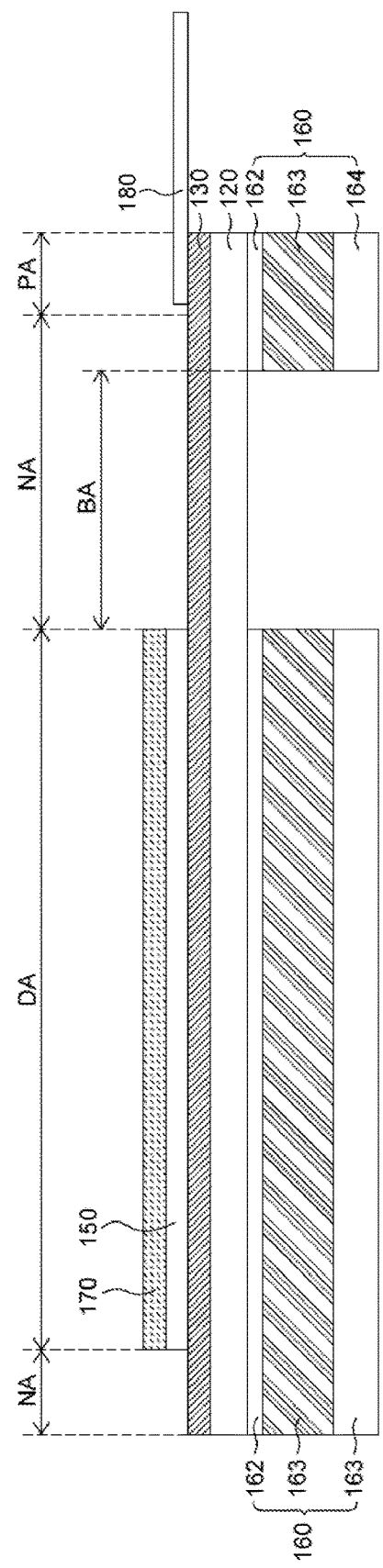

Referring to FIG. 3P, the polarizing plate 170 may be disposed on the display unit 150. An adhesive layer such as OCA may be disposed on a back surface of the polarizing plate 170, and the polarizing plate 170 may be bonded to an upper surface of the display unit 150. FIG. 3P is a cross-sectional view illustrating the cross-sectional view in FIG. 3O with a different height-to-width ratio of the view. FIG. 3P is changed only in view ratios as compared with FIG. 3O.

Then, a COF 180 is bonded to the pad area PA (S170).

Referring to FIG. 3P, the COF 180 is bonded to the pad area PA of the flexible substrate 120. The COF 180 may be implemented in a state where a chip such as a driver IC is mounted on a base film formed of a flexible material. FIG. 3P illustrates that the COF 180 is bonded to the pad area PA. However, the present disclosure is not limited thereto. Various modules such as a flexible printed circuit board may be bonded to the pad area PA.

In some exemplary embodiments, a laser trimming process may be performed to modify an outward form of the flexible substrate 120. For example, if the organic light emitting display device is applied to a product having a non-rectangular shape such as a smart watch, the outward form of the flexible substrate 120 may be modified to be suitable for a shape of the product. For example, if the organic light emitting display device is applied to a round edge smart watch, a laser trimming process for trimming the edges of the flexible substrate 120 into a round shape may be further performed.

Then, a micro cover layer (MCL) 190 is coated (S175).

Figure 3Q:
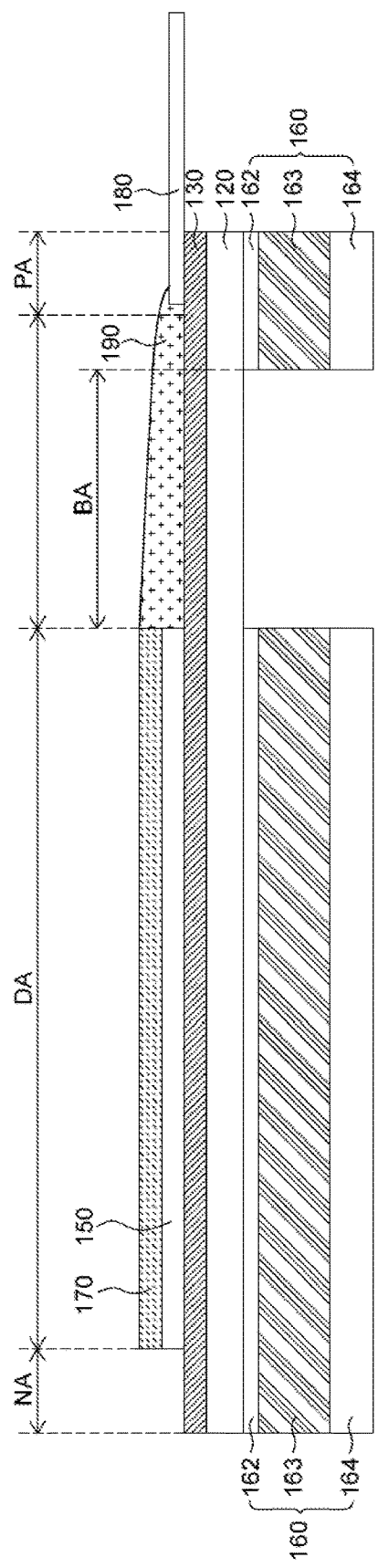

Referring to FIG. 3Q, the MCL 190 is coated on the bending area BA of the flexible substrate 120. The MCL 190 is an insulation layer disposed to reduce a stress applied to various lines and various insulation layers disposed in the bending area BA. That is, since the micro cover layer 190 is disposed in the bending area BA, the position of a neutral plane in the bending area BA may be adjusted. Further, a line and an insulation layer to be applied with a stress when the bending area BA is bent are disposed to be as adjacent as possible to the neutral plane. Thus, it is possible to minimize cracks of the line and the insulation layer when the bending area BA is bent.

Then, the organic light emitting display device is bent using a shape-preserving material 195 (S180).

The shape-preserving material 195 is used to define a bending curvature when the organic light emitting display device is bent. The organic light emitting display device bent using the shape-preserving material 195 will be described in more detail with reference to FIG. 4A.

Figure 4A:
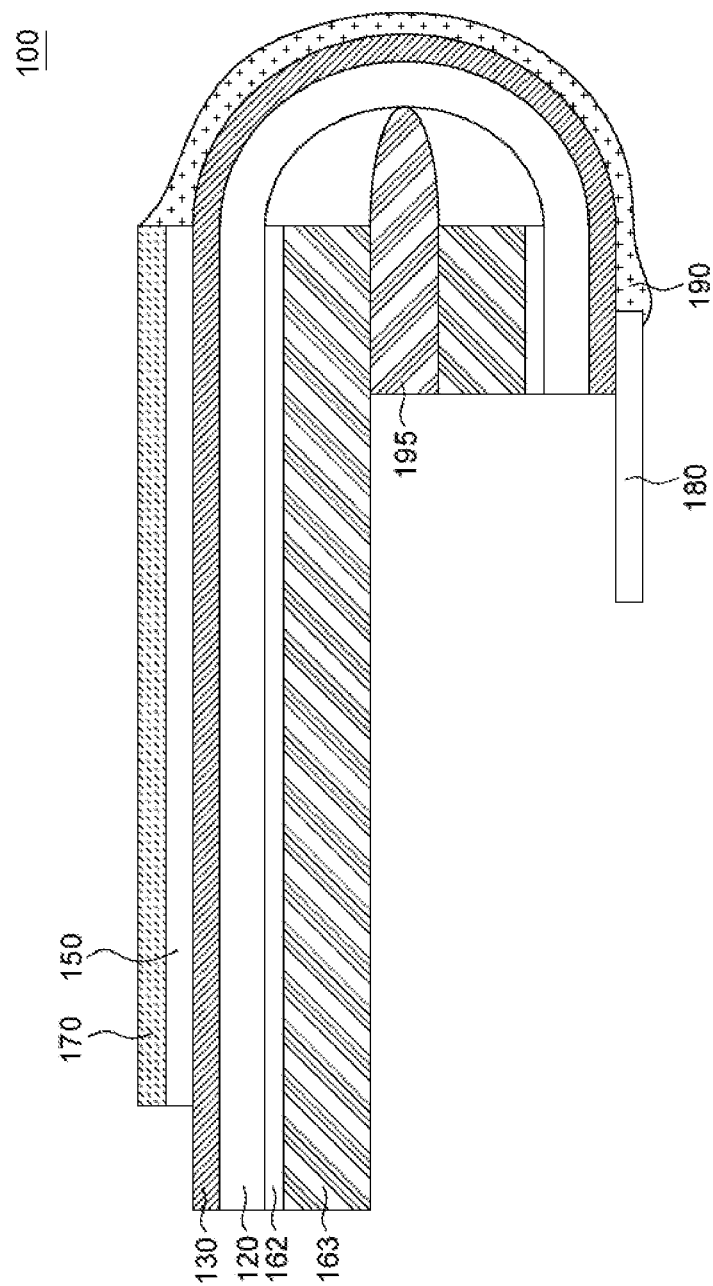
FIG. 4A is a cross-sectional view of an organic light emitting display device according to an exemplary embodiment of the present disclosure.

FIG. 4A is a cross-sectional view of an organic light emitting display device according to an exemplary embodiment of the present disclosure.

Referring to FIG. 4A, an organic light emitting display device 100 may be bent using the shape-preserving material 195. Firstly, before the organic light emitting display device 100 is bent, the second protective film 164 of the supporting film 160 is removed. Then, the organic light emitting display device 100 may be bent such that the back plate can be in contact with an upper surface and a lower surface of the shape-preserving material 195. When the flexible substrate 120 is in contact with one end of the shape-preserving material 195, a bending curvature of the organic light emitting display device 100 may be defined. However, the present disclosure is not limited thereto. The shape-preserving material 195 may not be in contact with the flexible substrate 120.

In the method of manufacturing an organic light emitting display device according to an exemplary embodiment of the present disclosure, the organic light emitting display device 100 is not manufactured into a cell unit, but manufactured into a mother substrate unit. Therefore, the number of apparatuses required and processing time are greatly reduced as compared with a case of manufacturing the organic light emitting display device 100 into a cell unit. Therefore, manufacturing costs can be reduced, so that productivity of the organic light emitting display device 100 can be greatly improved.

In case of the organic light emitting display device 100 including the bending area BA from among organic light emitting display devices including the flexible substrate 120, the back plate 163 is not disposed in the bending area BA to minimize a stress generated when the organic light emitting display device 100 is bent. Thus, in the process of manufacturing the organic light emitting display device 100 into a mother substrate unit, the supporting film 160 needs to be disposed in order for the back plate 163 not to be disposed in the bending area BA of all of a plurality of organic light emitting display devices 100.

Accordingly, in a process of manufacturing the supporting film into a mother substrate unit, the supporting film may be manufactured into a mother substrate unit in order for the back plate not to be disposed in the bending area BA. Specifically, the supporting film may be manufactured into a mother substrate unit by mechanically punching a portion of the back plate corresponding to the bending area BA. Otherwise, the supporting film may be manufactured into a mother substrate unit by separation through laser irradiation. However, the mother substrate unit supporting film has a large size. Thus, mechanical punching cannot be accurately performed and there may be an error during laser irradiation. If the mother substrate unit supporting film is not mechanically punched or has an error, it should be discarded as a defective product. Thus, manufacturing costs may be increased. Further, in the mother substrate unit supporting film, if there is an error only in a cell CE, the whole mother substrate unit supporting film should be discarded. Even if the mother substrate unit supporting film is normally manufactured, if the flexible substrate 120 and the supporting film are bent out of shape to more than an error tolerance during a process of bonding the supporting film to the flexible substrate 120, all of the plurality of cells CE should be discarded. Thus, productivity may be greatly decreased.

Thus, the mother substrate unit supporting film including the back plate in the bending area BA may be bonded to the flexible substrate 120 and then, the back plate corresponding to the bending area BA may be removed. However, the adhesive layer of a supporting film generally used, i.e., the adhesive layer for bonding the back plate and the flexible substrate 120, has a high adhesive strength. Thus, the back plate corresponding to the bending area BA may not be removed well. Even if the back plate is removed, the flexible substrate 120 or the organic light emitting diode may be damaged.

Accordingly, in the method of manufacturing an organic light emitting display device according to an exemplary embodiment of the present disclosure, the adhesive layer 162 used for bonding the back plate 163 may have an initial adhesive strength and a final adhesive strength different from each other. That is, before the back plate 163 disposed in the bending area BA is removed, the adhesive layer 162 may have adhesive strength which is enough for the back plate 163 to be bonded to the flexible substrate 120. After the back plate 163 disposed in the bending area BA is removed, the adhesive strength of the adhesive layer 162 may be increased to more securely fix the back plate 163 and the flexible substrate 120. Thus, separation can be suppressed. Accordingly, in the organic light emitting display device 100 according to an exemplary embodiment of the present disclosure, the mother substrate unit organic light emitting display device 100 including the flexible substrate 120 can be manufactured. Further, it is possible to provide improved productivity by changing adhesive strength of the adhesive layer 162 for bonding the back plate 163 to the flexible substrate 120.

Figure 4B:
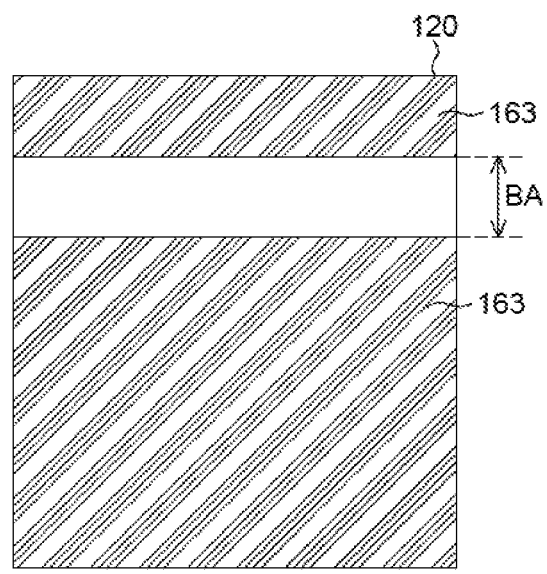
FIG. 4B is a back plan view of an organic light emitting display device according to an exemplary embodiment of the present disclosure.

FIG. 4B is a back plan view of an organic light emitting display device according to an exemplary embodiment of the present disclosure. FIG. 4B illustrates only the flexible substrate 120 and the back plate 163 from among various components of the organic light emitting display device 100.

As described above, the organic light emitting display device 100 is manufactured into a mother substrate unit. Thus, there is a difference in structure between an organic light emitting display device manufactured into a cell unit and the organic light emitting display device 100 according to an exemplary embodiment of the present disclosure.

In the organic light emitting display device 100 according to an exemplary embodiment of the present disclosure, the supporting film 160 manufactured into a mother substrate unit is bonded to the flexible substrate 120 and then, a portion of the supporting film 160 corresponding to the bending area BA is removed. Then, a plurality of organic light emitting display devices 100 is divided into cell units. Therefore, as illustrated in FIG. 4B, an end of the back plate 163 can be aligned with an end of the organic light emitting display device 100 and can also be aligned with the boundary of the bending area BA.

However, in the organic light emitting display device manufactured into a cell unit, a cell unit supporting film is also bonded to a flexible substrate. Thus, as illustrated in FIG. 4B, an end of the supporting film cannot be precisely aligned with an end of the flexible substrate. That is, during a process of manufacturing a supporting film into a cell unit, the supporting film may be manufactured so as to have the same size as the flexible substrate. However, the size of the flexible substrate cannot be exactly the same as the size of the supporting film due to a process error or the like. Therefore, even if the supporting film is bonded to a flexible substrate to align one side of the supporting film with one side of the flexible substrate, the other side of the supporting film cannot be aligned with the other side of the flexible substrate. Thus, the organic light emitting display device 100 according to an exemplary embodiment of the present disclosure can be distinguished from the cell unit organic light emitting display device conventionally used.

A supporting film according to an exemplary embodiment of the present disclosure can also be described as follows:

The supporting film includes a second protective film, a back plate on the second protective film, an adhesive layer on the back plate, and a first protective film on the adhesive layer. The adhesive strength of a material of the adhesive layer is changeable, the adhesive layer has a thickness of 25 μm or less, and the adhesive layer includes a dispersion inhibitor and an adhesion enhancer.

An organic light emitting display device according to an exemplary embodiment of the present disclosure can also be described as follows:

The organic light emitting display device includes a flexible substrate including a display area, a bending area extended from the display area, and a pad area extended from the bending area, a circuit unit positioned on a first surface of the flexible substrate, a display unit including an organic light emitting diode disposed on the circuit unit and electrically connected to the circuit unit, a polarizing plate on the display unit, an adhesive layer bonded to a second surface of the flexible substrate being an opposite surface of the first surface in an area except the bending area, and a supporting layer which is bonded to the adhesive layer and of which one side is disposed to correspond to one side of the flexible substrate. The adhesive strength of a material of the adhesive layer is changeable, and the supporting layer includes a first portion corresponding to the display area and a second portion corresponding to the pad area.

One side of the second portion of the supporting layer may correspond to the other side corresponding to the one side of the flexible substrate, one side of the first portion of the supporting layer may correspond to a boundary between the display area and the bending area, and the one side of the second portion of the supporting layer may correspond to an outline of the bending area adjacent to the pad area.

The flexible substrate may be bent such that the first portion of the supporting layer and the second portion of the supporting layer face each other.

The organic light emitting display device may further comprise a shape-preserving material positioned between the first portion of the supporting layer and the second portion of the supporting layer to define a bending curvature of the bending area. The adhesive strength of a material of the adhesive layer may be increased by curing using UV reaction, thermal reaction, or chemical reaction, the adhesive layer may have an initial adhesive strength of 3 gf/inch or more to 100 gf/inch or less, and the adhesive layer may be cured to have a final adhesive strength of 300 gf/inch.

A method of manufacturing an organic light emitting display device according to an exemplary embodiment of the present disclosure can also be described as follows:

The method of manufacturing an organic light emitting display device includes forming a sacrificial layer on a lower mother substrate in which a plurality of cells is defined, forming a flexible substrate on the sacrificial layer, forming a display unit including a circuit unit and an organic light emitting diode in each of the plurality of cells on the flexible substrate, removing the lower mother substrate, bonding a supporting film to the flexible substrate, irradiating a portion of the supporting film corresponding to a boundary of a bending area of the flexible substrate with a laser, removing a portion of the supporting film corresponding to the bending area of the flexible substrate, performing a process for enhancing adhesion of the supporting film remaining after removing a portion of the supporting film, irradiating a boundary between a non-display area extended from the bending area and a pad area extended from the non-display area with a laser, and separating the plurality of cells into cell units by radiating a laser to boundaries of the plurality of cells.

The method of manufacturing an organic light emitting display device may further comprise covering the circuit unit and the display unit with a temporary protective film after the forming of the circuit unit and the display unit. The temporary protective film may be removed after the separating of the plurality of cells into cell units.

The covering with the temporary protective film may include placing the temporary protective film so as to correspond to the entire one surface of the lower mother substrate.

The radiating of the laser to the boundary between the non-display area and the pad area may include etching the temporary protective film corresponding to the boundary between the non-display area and the pad area.

The temporary protective film may include a base film and an adsorption layer disposed on one surface of the base film and adsorbed to one surface of the lower mother substrate, and the adsorption layer may have an adhesive strength of 10 gf/inch or less.

The method of manufacturing an organic light emitting display device further comprise irradiating the lower mother substrate with a laser before the removing of the lower mother substrate. The radiating of the laser to the lower mother substrate may include irradiating the entire surface of the lower mother substrate being opposite surface of a surface on which the sacrificial layer is disposed and irradiating an edge area of the temporary protective film corresponding to an edge area of the lower mother substrate.

The irradiating of the edge area of the temporary protective film with the laser may include etching the flexible substrate and the sacrificial layer positioned corresponding to the edge area of the lower mother substrate.

The etching may include irradiating with a laser along a line inwardly spaced at a predetermined distance from an end of the lower mother substrate.

The performing of the process for enhancing adhesion of the remaining supporting film may include increasing an adhesive strength of an adhesive layer included in the supporting film by performing one of UV irradiation, thermal curing, and chemical reaction.

The thermal curing may be performed at a temperature of 60° C. to 70° C. for 5 minutes to 10 minutes so as to fully cure the adhesive layer.

The method of manufacturing an organic light emitting display device may further comprise performing a primer process to one surface of the flexible substrate to which the supporting film is to be bonded before the bonding of the supporting film to the flexible substrate. The primer process may be performed by keeping the flexible substrate and the supporting film at room temperature in a state where the supporting film is bonded to the flexible substrate.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method of manufacturing an organic light emitting display device, comprising:
    forming a sacrificial layer on a lower mother substrate in which a plurality of cells is defined;
    forming a flexible substrate on the sacrificial layer;
    forming a display unit including a circuit unit and an organic light emitting diode in each of the plurality of cells on the flexible substrate;
    removing the lower mother substrate;
    bonding a supporting film to the flexible substrate;
    irradiating a portion of the supporting film corresponding to a boundary of a bending area of the flexible substrate;
    removing a portion of the supporting film corresponding to the bending area of the flexible substrate;
    performing a process for enhancing adhesion of the supporting film remaining after removing a portion of the supporting film;
    irradiating a boundary between a non-display area extended from the bending area and a pad area extended from the non-display area; and
    separating the plurality of cells into cell units by irradiating boundaries of the plurality of cells.

2. The method of manufacturing an organic light emitting display device according to claim 1, further comprising:
    covering the circuit unit and the display unit with a temporary protective film after the forming of the circuit unit and the display unit,
    wherein the temporary protective film is removed after the separating of the plurality of cells into cell units.

3. The method of manufacturing an organic light emitting display device according to claim 2, wherein the covering with the temporary protective film includes placing the temporary protective film so as to correspond to the entire one surface of the lower mother substrate.

4. The method of manufacturing an organic light emitting display device according to claim 3, wherein the irradiating of the boundary between the non-display area and the pad area includes etching the temporary protective film corresponding to the boundary between the non-display area and the pad area.

5. The method of manufacturing an organic light emitting display device according to claim 3, wherein the temporary protective film includes a base film and an adsorption layer disposed on one surface of the base film and adsorbed to one surface of the lower mother substrate, and
    the adsorption layer has an adhesive strength of 10 gf/inch or less.

6. The method of manufacturing an organic light emitting display device according to claim 2, further comprising:
    irradiating the lower mother substrate before the removing of the lower mother substrate, wherein the irradiating the lower mother substrate includes:
    irradiating the entire surface of the lower mother substrate at a first surface opposite a second surface on which the sacrificial layer is disposed; and
    irradiating an edge area of the temporary protective film corresponding to an edge area of the lower mother substrate.

7. The method of manufacturing an organic light emitting display device according to claim 6, wherein the irradiating the edge area of the temporary protective film includes etching the flexible substrate and the sacrificial layer positioned corresponding to the edge area of the lower mother substrate.

8. The method of manufacturing an organic light emitting display device according to claim 7, wherein the etching includes radiating a laser along a line inwardly spaced at a predetermined distance from an end of the lower mother substrate.

9. The method of manufacturing an organic light emitting display device according to claim 6, wherein the performing of the process for enhancing adhesion of the remaining supporting film includes increasing an adhesive strength of an adhesive layer included in the supporting film by performing one of UV irradiation, thermal curing, and chemical reaction.

10. The method of manufacturing an organic light emitting display device according to claim 9, wherein the thermal curing is performed at a temperature of 60° C. to 70° C. for 5 minutes to 10 minutes so as to fully cure the adhesive layer.

11. The method of manufacturing an organic light emitting display device according to claim 9, further comprising:
    performing a primer process to one surface of the flexible substrate to which the supporting film is to be bonded before the bonding of the supporting film to the flexible substrate,
    wherein the primer process is performed by keeping the flexible substrate and the supporting film at room temperature in a state where the supporting film is bonded to the flexible substrate.

12. A method of manufacturing an flexible display device, comprising:
    providing, on a mother substrate where a plurality of cells is defined, a flexible substrate that accommodates a circuit unit and an organic light emitting diode;
    bonding a supporting film that an adhesive layer having an initial adhesive strength and a final adhesive strength stronger than the initial adhesive strength on a back surface of the flexible substrate after removing the mother substrate;

irradiating a boundary of a bending area of the supporting film;

removing the boundary of the bending area which is irradiated in order to bend more easily;

enhancing adhesion of the supporting film remaining by performing one of UV irradiation, thermal curing, and chemical reaction;

irradiating boundaries of the plurality of cells; and dividing a plurality of cells into cell units.

13. The method according to claim 12, further comprising:

forming a barrier film between the circuit unit and the organic light emitting diode.

14. The method according to claim 12, further comprising:

laminating a temporary protective film on the circuit unit and the organic light emitting diode;

wherein the temporary protective film is removed after the dividing of the plurality of cells into cell units.

15. The method according to claim 12, wherein the adhesive layer of the remaining supporting film is in a full-curing state for suppressing a separation between the remaining supporting film and the flexible substrate.

\* \* \* \* \*